United States Patent [19]

Nishikawa

[11] 4,006,427

[45] Feb. 1, 1977

[54] AUTOMATIC GAIN CONTROL CIRCUIT
[75] Inventor: Masao Nishikawa, Nagoya, Japan
[73] Assignee: Shin-Shirasuna Electric Corporation, Japan
[22] Filed: Apr. 2, 1976
[21] Appl. No.: 673,045
[30] Foreign Application Priority Data
  Aug. 22, 1975 Japan .................. 50-101802
[52] U.S. Cl. .................. 330/29; 179/1 G; 330/30 R; 179/15 BT
[51] Int. Cl.² .................. H03G 3/30
[58] Field of Search ......... 179/1 G, 15 BT; 325/36, 325/408, 410; 330/29, 30 R

[56] References Cited
UNITED STATES PATENTS
3,177,441  4/1965  Everaars .............. 179/1 G X

*Primary Examiner*—R. V. Rolinec
*Assistant Examiner*—Lawrence J. Dahl

[57] ABSTRACT

In a recording system or the like including two, left and right, channels, an automatic gain control circuit for ensuring that the characteristics of the two channels always be substantially equal to each other, wherein a variable impedance circuit comprising at least one transistor is provided in association with each of the foregoing channels; a correcting variable resistor is connected between the bases of the transistors; and a control signal source is provided which has one terminal thereof connected to the movable contact of the correcting variable resistor, the other terminal of the control signal source being grounded and connected across the correcting variable resistors through shunt resistors.

2 Claims, 2 Drawing Figures

AUTOMATIC GAIN CONTROL CIRCUIT

BACKGROUND OF THE INVENTION

1. Field of the Invention

This invention relates to an automatic gain control circuit, and more particularly it pertains to an automatic gain control circuit for recording systems or the like including two, left and right, channels, which is so designed as to ensure that the characteristics of the two channels always be substantially equal to each other.

2. Description of the Prior Art

In such a type of circuit, there is a tendency that difference in gain control effect occurs between the two channels due to deviations in the base-emitter voltage versus base current characteristics and internal resistances of the transistors constituting the circuit. In the case of two-channel stereo equipment, for example, the above-mentioned difference in gain control effect should be eliminated since it is desired that no difference in characteristics be present between the two channels.

To cope with the foregoing problem, it has heretofore been the usual practice to adopt a circuit arrangement such as one which will be described hereinafter with reference to FIG. 1 of the accompanying drawings. With such a conventional circuit arrangement, however, it was not possible to achieve a satisfactory correcting effect. The reason for this will also be explained hereinafter.

SUMMARY OF THE INVENTION

Accordingly, it is an object of this invention to provide a novel and improved automatic gain control ciruit capable of overcoming the aforementioned difficulties of the prior art.

According to one aspect of this invention, a correcting variable resistor is connected between the bases of transistors constituting variable impedance circuits associated with the two channels respectively. Furthermore, a control signal source is provided which has one terminal thereof connected to the movable contact of the variable resistor and the other terminal thereof connected across the variable resistor through a first and a second shunt resistor. Still furthermore, coupling resistors are connected to the bases of the transistors in parallel with the variable resistor, respectively.

Other objects, features and advantages of this invention will become fully apparent from the following detailed description taken in conjunction with the accompanying drawings.

DESCRIPTION OF THE PREFERRED EMBODIMENT

In order to give a better understanding of this invention, description will first be made of the conventional circuit arrangement shown in FIG. 1, wherein references $t_1$ and $t_2$ represent a left channel input terminal and a right channel input terminal, respectively. Signals arriving at these input terminals $t_1$ and $t_2$ will be passed to an amplifier (not shown) through conductors $a_1$ and $a_2$. References $t'_1$ and $t'_2$ indicate output terminals at which left-channel and right-channel outputs are available, respectively, which will in turn be rectified by diodes $D_1$ and $D_2$ and then passed to a capacitor C which is grounded at one end thereof and adapted to constitute a control signal source 1. Transistors $Q_1$ and $Q_2$ form a variable impedance circuit which is associated with the left channel, and transistors $Q'_1$ and $Q'_2$ constitute another variable impedance circuit which is associated with the right channel. The bases of the transistors $Q_1$ and $Q'_1$ are connected to the opposite ends of a correcting variable resistor $R_r$ through resistors $R_1$ and $R_2$ respectively. The correcting variable resistor $R_r$ has a movable contact 2 which is connected to the control signal source 1 through a suitable resistor $R_{22}$. More specifically, the movable contact 2 of the variable resistor is connected to the connection point between the diodes $D_1$ and $D_2$ to which is also connected the non-grounded terminal of the capacitor C constituting the control signal source 1.

In the above-described conventional circuit arrangement, the base currents of the transistors $Q_1$ and $Q'_1$ are varied by displacing the movable contact 2 of the correcting variable resistor $R_r$, so that the impedances of the variable impedance circuit for the left and right channels are varied correspondingly, with a result that the gains of the two channels are controlled. The conventional circuit mentioned above is so designed that the respective channel gains can be controlled by complementarily changing the resistances which are connected in series between the bases of the transistors $Q_1$ and $Q'_1$ and the control signal source 1. In case there are no base currents of these transistors, then no correction will be effected by the aforementioned series resistances connected between the bases thereof. Thus, it follows that with the above-mentioned conventional circuit arrangement, it is not possible to produce a correcting effect over a wide range of control signal level since such an effect is obtained only when there are sufficient base currents of the respective transistors.

Figure 1:
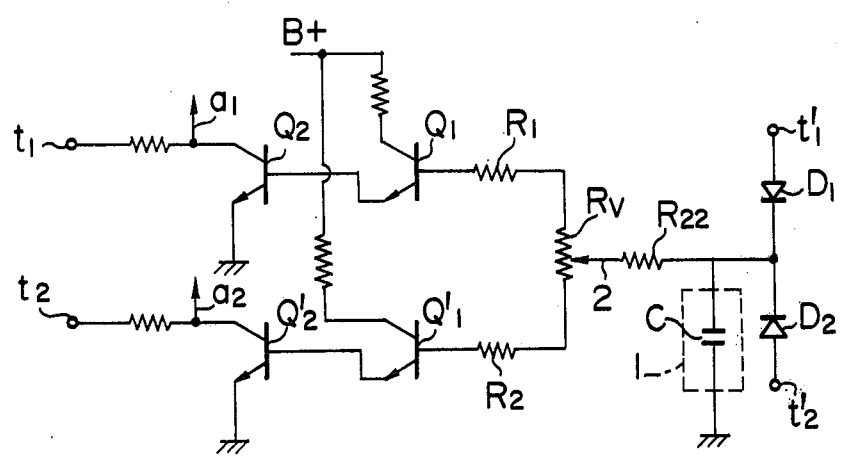
FIG. 1 is a diagram showing the conventional automatic gain control circuit.
Figure 2:
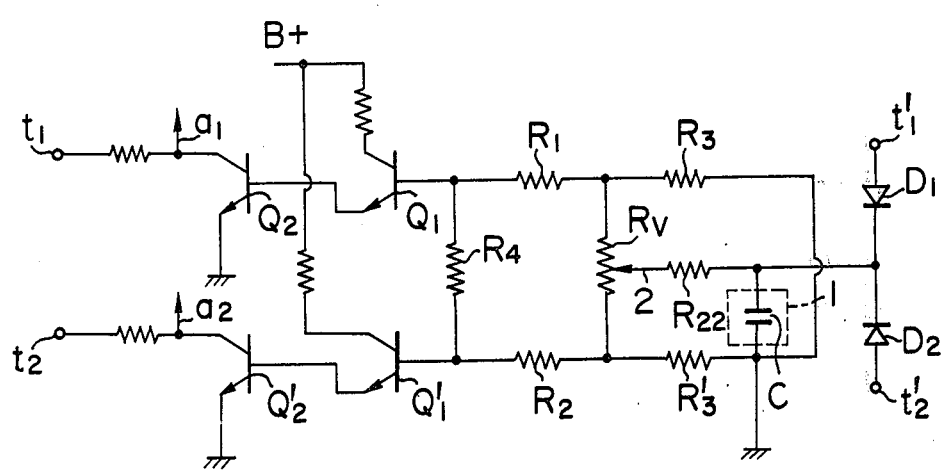
FIG. 2 is a diagram showing the automatic gain control circuit according to an embodiment of this invention.

Referring now to FIG. 2, there is shown an example of the circuit arrangement embodying this invention, wherein parts corresponding to FIG. 1 are indicated by like reference symbols just the sake of convenience. It is to be understood that the types and/or values of those parts can suitably be selected in accordance with this invention.

In this embodiment, there is provided a control signal circuit 1 which is constituted by a capacitor C having one end thereof grounded and the other end thereof connected to the movable contact 2 of a correcting variable resistor $R_r$. The grounded terminal of the control signal source 1 is connected to the opposite ends of the variable resistor $R_r$ through resistors $R_3$ and $R'_3$. Furthermore, a coupling resistor $R_4$ is connected between the bases of transistors $Q_1$ and $Q'_1$ in parallel with the correcting variable resistor $R_r$.

Description will now be made of the operation of the circuit shown in FIG. 2. In case the control signal level is so low that the base currents of the transistors $Q_1$ and $Q'_1$ are relatively low, then d.c. voltages $V_1$ and $V_2$ will be obtained at the opposite ends of the correcting variable resistor $R_r$ respectively, as a result of the fact that the control signal is divided by two series resistance circuits, one of which is formed by the resistor $R_3$ and that portion of the variable resistor $R_v$ which exists between the movable contact 2 and the connection point between the resistor $R_3$ and the variable resistor $R_r$, the other of the two series resistance circuits being formed by the resistor $R'_3$ and the remaining portion of the variable resistor $R_r$. The thus obtained d.c. voltages $V_1$ and $V_2$ will be imparted to the bases of the transistors $Q_1$ and $Q'_1$ respectively. In this case, even if there is any difference between the base currents of the transistors $Q_1$ and $Q'_1$, the d.c. voltages $V_1$ and $V_2$ will be complementarily varied by displacing the movable contact 2 of the correcting variable resistor $R_r$; thus, the bases of the transistors $Q_1$ and $Q'_1$ will be provided with different voltages by which any deviation in the base-emitter voltage versus base current characteristics between the two transistors can be compensated for at the rise point of the characteristics. In this way, a balanced condition at the rise point mentioned just above will be established.

On the other hand, in case the control signal level is relatively high so that the base currents of the transistors $Q_1$ and $Q'_1$ are increased, then will be a possibility that such base currents become different from each other due to the differences between the base-emitter internal resistances of the transistors $Q_1$ and $Q_2$ and those of the transistors $Q'_1$ and $Q'_2$. In sucha a case, voltage drops will occur in a parallel resistance circuit formed by the resistor $R_3$ and a resistance portion of the variable resistor $R_r$ and in another parallel resistance circuit formed by the resistor $R'_3$ and the remaining portion of the variable resistor $R_r$, respectively. Thus, such voltage drops will appear at the opposite ends of the coupling resistor $R_4$ respectively so that the base voltage of the transistor $Q_1$ or $Q'_1$ whose base current is higher, will be made to be lower than that of the transistor $Q'_1$ or $Q_1$ whose base current is lower. By virtue of the fact the coupling resistor $R_4$ is connected between the bases of the transistor $Q_1$ and $Q'_1$, the higher base voltage and the lower one will be caused to coact in such directions as to be offset each other; thus, the base voltages of the transistors $Q_1$ and $Q'_1$ will become substantially equal to each other. In this way, substantially equal gains will be obtained in the two channels.

As will be appreciated from what has been described above, in accordance with this invention, it is possible to eliminate the aforementioned drawbacks of the prior art.

While this invention has been described with respect to one specific embodiment of this invention, it is to be understood that the foregoing description is only exemplary of the invention and various modifications and changes may be made therein within the spirit and scope of the invention as defined in the appended claims.

What is claimed is:
1. An automatic gain control circuit for recording systems or the like including two channels, wherein first and second variable impedance circuits each comprising at least one transistor are associated with said two channels respectively so that the gains of the respective channels can be controlled by changing the impedances of said variable impedance circuits in accordance with the base currents of said transistors, characterized in that a correcting variable resistor provided with a movable contact is connected at the opposite ends thereof to the bases of the transistors constituting said first and second variable impedance circuits respectively, said movable contact being connected to one terminal of a control signal source the other end of which is connected to the opposite ends of said correcting variable resistor through a first shunt resistor and second shunt resistor respectively, and that a coupling resistor is connected between the bases of said transistors.

2. An automatic gain control circuit according to claim 1, wherein each of said first and second variable impedance circuits is constituted by a first transistor and a second transistor having the base thereof connected to the emitter of said first transistor, said coupling resistor is connected between the bases of said first transistors, said variable resistor is connected at the opposite ends thereof to the bases of said first transistors, and said control signal source is constituted by a capacitor having one terminal thereof grounded, the grounded terminal of said capacitor being connected to the opposite ends of said variable resistor through said first and second shunt resistors respectively, the other terminal of said capacitor being connected to said movable contact of said variable resistor.

* * * * *